United States Patent
Yehezkely et al.

(10) Patent No.: US 9,729,190 B2
(45) Date of Patent: Aug. 8, 2017

(54) SWITCHABLE ANTENNA ARRAY

(71) Applicant: QUALCOMM Incorporated, San Diego, CA (US)

(72) Inventors: Alon Yehezkely, Haifa (IL); Tamir Levinger, Kiryat Mozkin (IL); Sagi Kupferman, Givatayim (IL); Sergey Levin, Maalot (IL)

(73) Assignee: QUALCOMM Incorporated, San Diego, CA (US)

( * ) Notice: Subject to any disclaimer, the term of this patent is extended or adjusted under 35 U.S.C. 154(b) by 67 days.

(21) Appl. No.: 14/569,206

(22) Filed: Dec. 12, 2014

(65) Prior Publication Data

US 2015/0207536 A1    Jul. 23, 2015

Related U.S. Application Data

(60) Provisional application No. 61/928,660, filed on Jan. 17, 2014.

(51) Int. Cl.
| | |
|---|---|
| *H04B 1/44* | (2006.01) |
| *H04B 1/40* | (2015.01) |
| *H03H 11/02* | (2006.01) |
| *H01Q 3/24* | (2006.01) |
| *H03H 7/46* | (2006.01) |
| *H04B 1/00* | (2006.01) |
| *H03K 17/06* | (2006.01) |

(52) U.S. Cl.
CPC ............ *H04B 1/44* (2013.01); *H01Q 3/24* (2013.01); *H03H 7/465* (2013.01); *H03H 11/02* (2013.01); *H04B 1/0064* (2013.01); *H03K 2017/066* (2013.01)

(58) Field of Classification Search
CPC ........................................................ H04B 1/44
See application file for complete search history.

(56) References Cited

U.S. PATENT DOCUMENTS

| | | |
|---|---|---|
| 3,794,941 A | 2/1974 | Templin |
| 4,201,960 A | 5/1980 | Skutta et al. |
| 8,170,505 B2 | 5/2012 | Keerti et al. |
| 8,629,813 B2 | 1/2014 | Milosavljevic |
| 2004/0092285 A1 | 5/2004 | Kodim |
| 2008/0238570 A1* | 10/2008 | Hangai ............... H01P 1/15 333/103 |
| 2009/0051464 A1 | 2/2009 | Atsumo |
| 2009/0267588 A1* | 10/2009 | Schmitz ............... H02J 1/14 323/352 |
| 2010/0321129 A1 | 12/2010 | Onody et al. |
| 2011/0102291 A1 | 5/2011 | Rofougaran |

(Continued)

FOREIGN PATENT DOCUMENTS

| | | |
|---|---|---|
| EP | 0208984 A1 | 1/1987 |
| JP | 2005101097 A | 4/2005 |

OTHER PUBLICATIONS

International Search Report and Written Opinion—PCT/US2014/070379—ISA/EPO—Mar. 11, 2015, 18 pages.

*Primary Examiner* — Cindy Trandai
(74) *Attorney, Agent, or Firm* — Qualcomm Incorporated-Toler

(57) ABSTRACT

An apparatus includes an impedance circuit and a plurality of inductors coupled to the impedance circuit. Each of the plurality of inductors is coupled in parallel to a corresponding switch of a plurality of switches.

20 Claims, 5 Drawing Sheets

(56) References Cited

U.S. PATENT DOCUMENTS

| | | |
|---|---|---|
| 2011/0249576 A1 | 10/2011 | Chrisikos et al. |
| 2013/0222075 A1* | 8/2013 | Reedy ................ H03M 1/1061 333/32 |
| 2014/0009364 A1 | 1/2014 | Yehezkely |
| 2015/0072671 A1* | 3/2015 | Rofougaran ............ H04B 1/44 455/418 |
| 2015/0118984 A1* | 4/2015 | Nagumo ............ H04B 1/0458 455/193.1 |

* cited by examiner

SWITCHABLE ANTENNA ARRAY

I. CROSS-REFERENCE TO RELATED APPLICATIONS

The present application claims priority from U.S. Provisional Patent Application No. 61/928,660, filed Jan. 17, 2014 and entitled "SWITCHABLE ANTENNA ARRAY," the content of which is incorporated by reference in its entirety.

II. FIELD

The present disclosure is generally related to a switchable antenna array.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Advances in technology have also resulted in many antennas using antenna arrays that contain a plurality of antenna elements. The number of antenna elements may be configurable to adapt to operation of an electronic device. For example, a first number of antenna elements may be used in certain modes of operation, and a second number of antenna elements may be used in a different mode of operation. Some systems provide configurable antenna arrays by selectively shutting off power to active elements (e.g., power amplifiers (PAs) and low noise amplifiers (LNAs)) coupled to the antennas. However, the summing/distribution network of the radio frequency integrated circuit (RFIC) is typically implemented via a non-configurable passive element, such as a Wilkinson power combiner. Reconfiguration of an antenna array often results in power loss and noise due to inefficiencies. For example, when certain active elements coupled to selected antenna elements (e.g., an LNA or a PA in one or more transmit/receive paths coupled to antenna elements) are turned off, the signal paths associated with the turned off antenna elements may cause noise and interference due to impedance mismatch and timing issues.

IV. BRIEF DESCRIPTION OF THE DRAWINGS

V. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
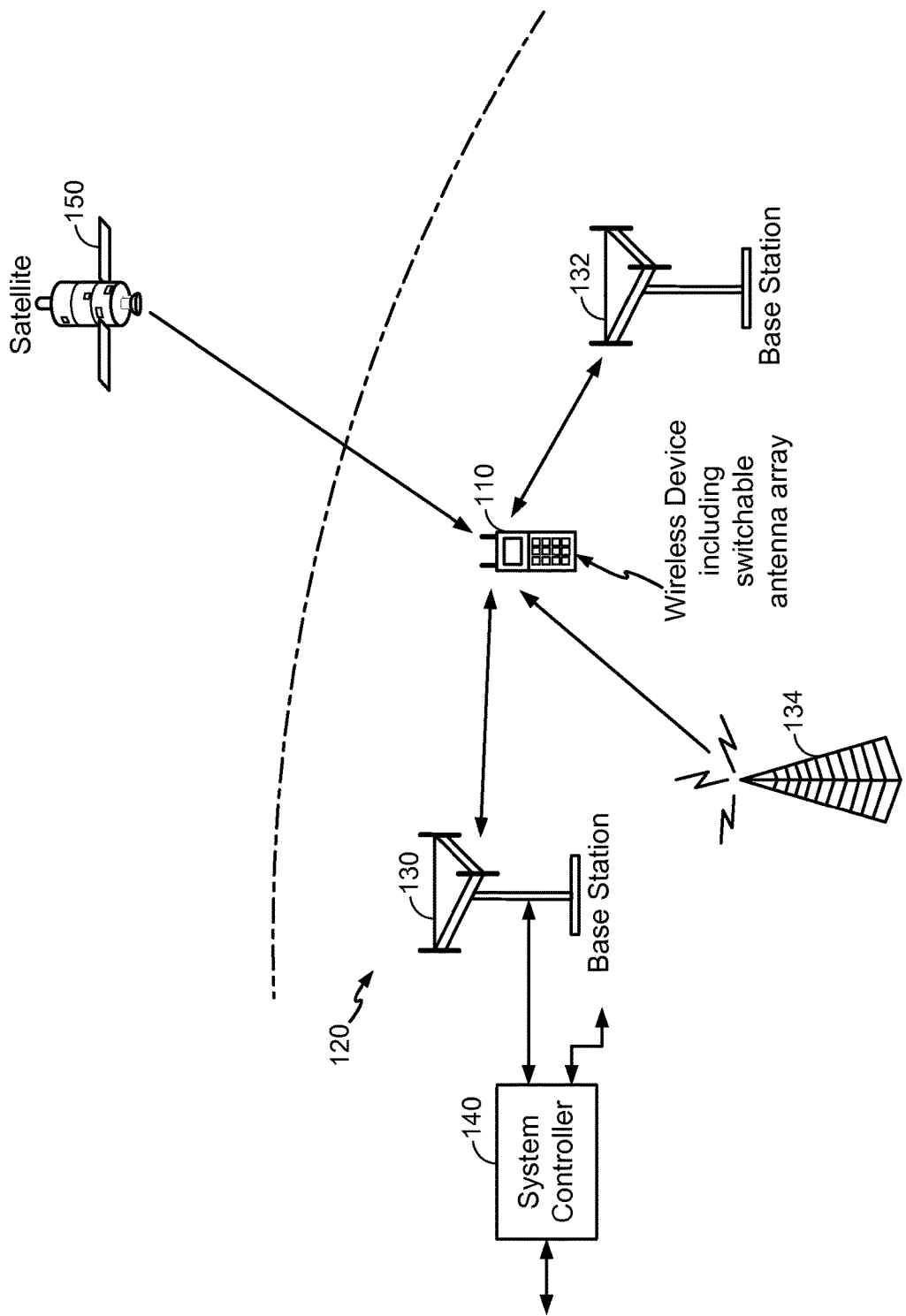
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with the wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

The wireless device 110 may also include one or more switchable antenna arrays (e.g. phased antenna arrays) that each include a plurality of antennas (or antenna elements). The plurality of antennas (or antenna elements) may be used with a configurable distribution and summing (CDS) network.

Figure 2:
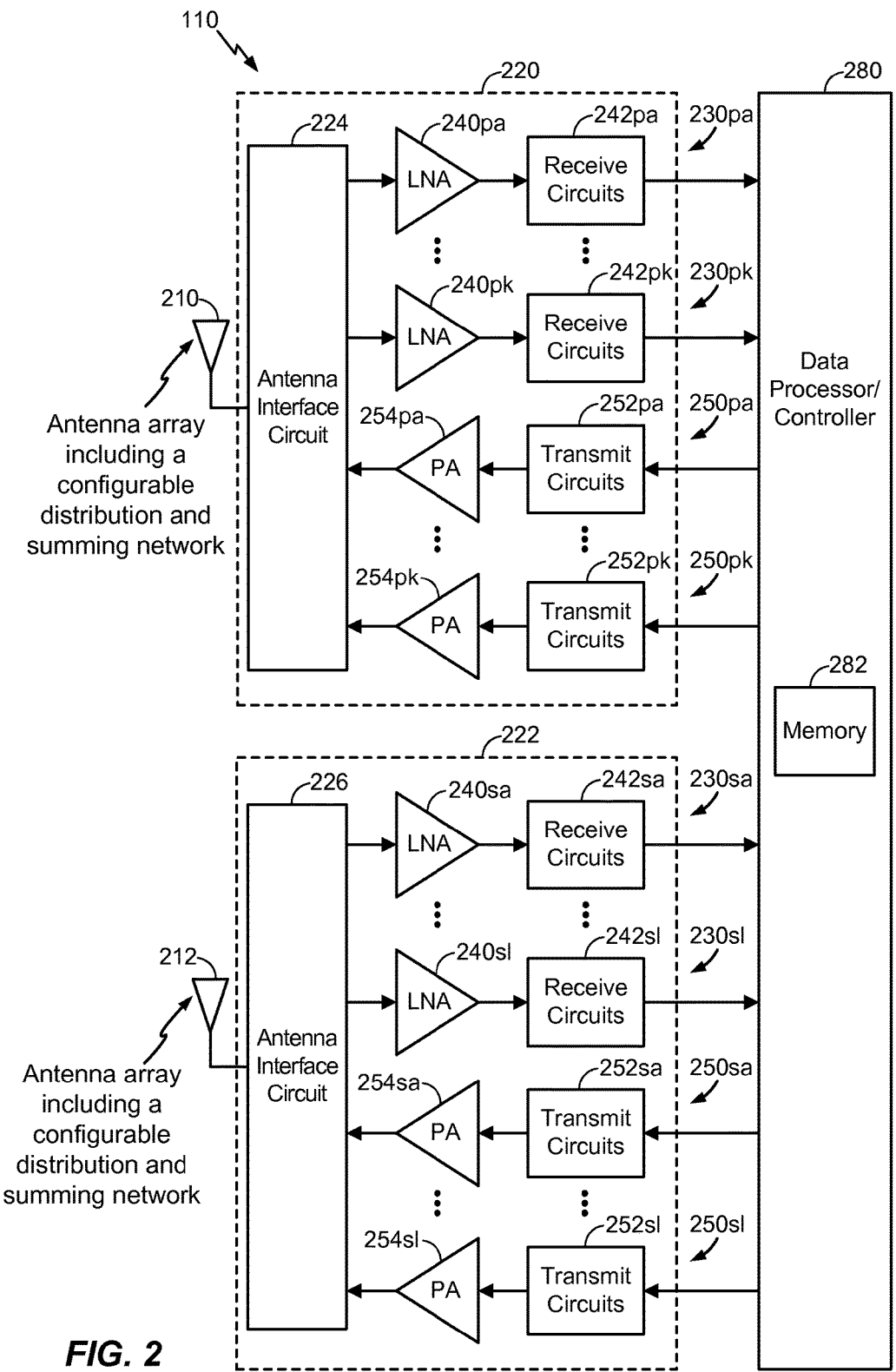
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna array 210 via an antenna interface circuit 224, a transceiver 222 coupled to a secondary antenna array 212 via an antenna interface circuit 226, and a data processor/controller 280. The primary antenna array 210 and/or the secondary antenna array 212 may be switchable and may include a configurable distribution and summing (CDS) network, as further described with reference to FIGS. 3-4. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, the antenna array 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230*pa* is the selected receiver. Within receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor/controller 280. Receive circuits 242*pa* may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230*pa*.

In the exemplary design shown in FIG. 2, each transmitter 250 includes transmit circuits 252 and a power amplifier (PA) 254. For data transmission, data processor/controller 280 processes (e.g., encodes and modulates) data to be transmitted and provides an analog output signal to a selected transmitter. The description below assumes that transmitter 250*pa* is the selected transmitter. Within transmitter 250*pa*, transmit circuits 252*pa* amplify, filter, and upconvert the analog output signal from baseband to RF and provide a modulated RF signal. Transmit circuits 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through antenna interface circuit 224 and transmitted via the antenna array 210. Each remaining transmitter 250 in transceivers 220 and 222 may operate in similar manner as transmitter 250*pa*.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple frequency band groups, multiple radio technologies, and/or multiple antennas. Wireless device 110 may include a number of LNAs to support reception via the multiple frequency band groups, multiple radio technologies, and/or multiple antennas.

Figure 3:
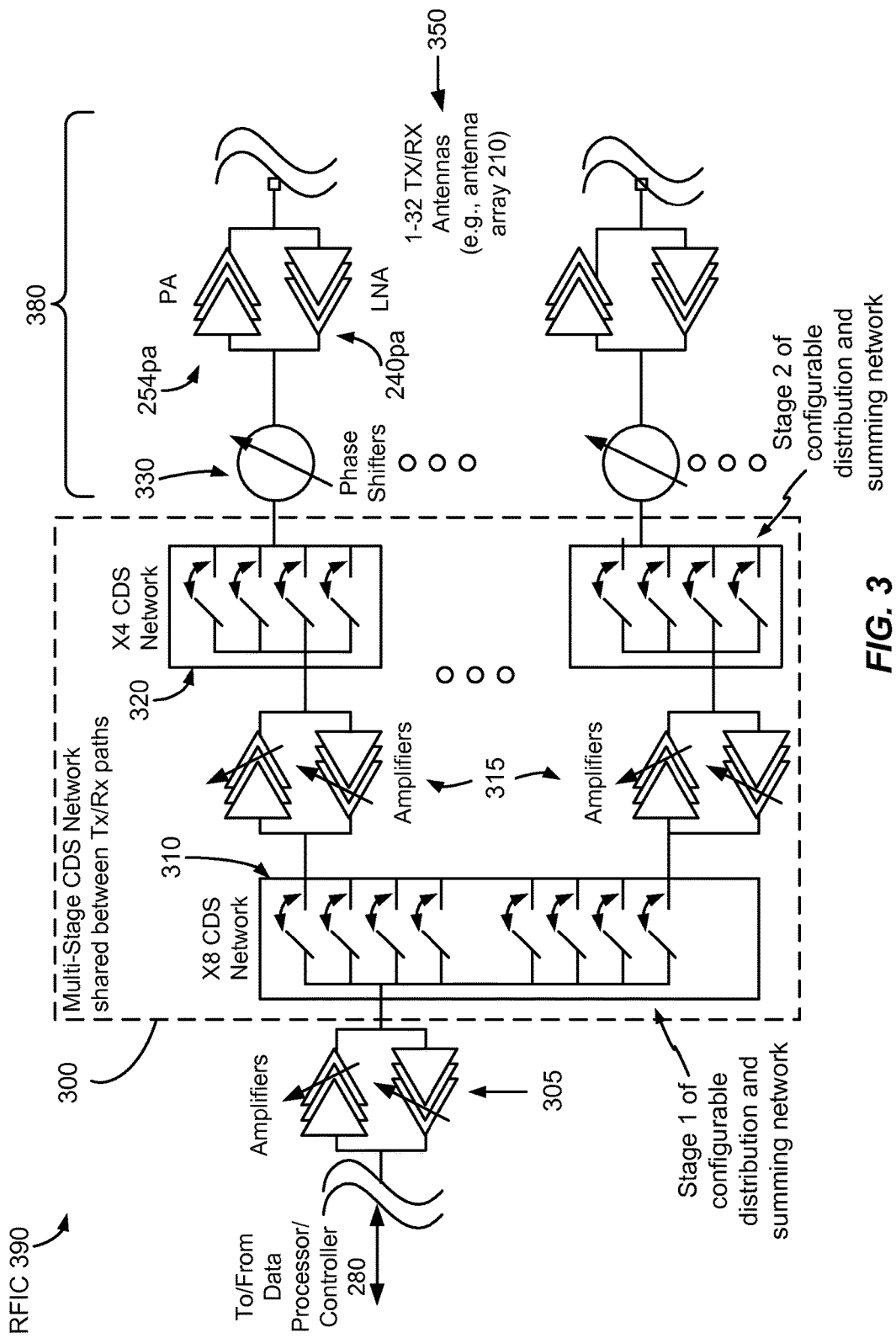
FIG. 3 shows multiple configurable distribution and summing networks.

FIG. 3 shows a first exemplary CDS network 310 and a second exemplary CDS network 320, each of which may be associated with an antenna array (e.g., one of the antenna arrays 210, 212 of FIG. 2). An exemplary CDS system 300 may include multiple CDS networks, such as the CDS networks 310, 320. The first CDS network 310 corresponds to a first stage of the CDS system 300, and the second CDS network 320 corresponds to a second stage of the CDS system 300. A CDS network may be used with multiple antennas 350 (e.g., antennas of the antenna array 210 or 212). The CDS network may be used to maintain reasonable return loss and very low insertion loss over all configurations of a configurable antenna array.

In an exemplary embodiment, a signal path (e.g., a transmit path and/or a receive path) may traverse multiple stages of CDS network(s). A stage of the CDS network(s) "closest" to antennas/antenna elements may include one switch per antenna/antenna element. To illustrate, in the embodiment of FIG. 3, stage 2 may include 32 switches (e.g., eight 4-switch CDS networks, such as the 4-switch CDS network 320), where each of the 32 switches is connected to one of the 32 antennas 350. When a particular one of the 32 switches is off, the corresponding antenna is disconnected (e.g., electrically isolated from a remainder of the CDS system 300). When a particular one of the 32 switches is on, the corresponding antenna is connected, and the CDS system 300 may combine a signal from the corresponding antenna with signals from other antennas. Moving from the stage "closest" to the antennas 350 to stages that are further away, the total number of switches may decrease. For example, in a binary tree configuration, a next stage of the CDS system 300 may include 16 switches (e.g., two 8-switch CDS networks, such as the 8-switch CDS network 310), although non-binary configurations may be used in alternative embodiments. Thus, an antenna array including the 32 antennas 350 may be considered "switchable" because different on/off switch combinations within the CDS system 300 may be used to implement different antenna configurations (e.g., different combinations of the antennas 350 being used during signal reception and/or transmission).

For example, during signal reception, signals from up to 32 antennas may be routed through the CDS network(s) and combined to form a combined signal. Different antenna configurations may be selected by changing the on/off position of one or more of the switches within the CDS system 300. For example, the CDS system 300 may support $^{32}C_1=32$ possible configurations in which a single antenna is connected, $^{32}C_2=496$ possible configurations in which two antennas are connected, etc. (where $^xC_y$ is the number of possible combinations of selecting y items from x total items).

During signal reception, the antenna(s) 350 receive external signals (e.g., RF signals) and provide a received signal via an antenna interface circuit (e.g., the antenna interface circuit 224) to the LNA 240*pa*. The LNA 240*pa* amplifies an input signal and provides an output signal to the CDS system 300 via phase shifters 330, as shown. The CDS system 300 includes multiple stages separated by amplifiers (e.g., amplifier circuits). For example, during signal reception, a stage of the CDS system 300 corresponding to the CDS network 320 may receive a signal from the phase shifters 330. The signal may travel through the CDS network 320, where each switch of the CDS network 320 is on or off depending on a selected antenna configuration. The CDS network 320 may output a signal that is amplified (e.g., by amplifiers 315) and provided to a "next" stage of the CDS system 300 (e.g., the CDS network 310). The CDS/amplifier process may be repeated as the signal travels through additional stages of a CDS system. An output of the CDS system 300 may be amplified by amplifiers 305 and provided to a data processor/controller (e.g., the data processor/controller 280), as shown. In an exemplary embodiment, the CDS system 300, the phase shifters 330, and the amplifiers 305 may correspond to (e.g., may be included within) the receive circuits 242 and/or the transmit circuits 252 of FIG. 2. In an exemplary embodiment, the stage(s) of the CDS system 300 (e.g., the CDS networks 310, 320), the amplifiers 305, the amplifiers 315, the phase shifters 330, the PA 254, and/or the LNA 240 are included in a RFIC 390.

During signal transmission, the data processor/controller 280 provides a signal that is received by the CDS system 300 via the amplifiers 305. The signal may travel through stages of the CDS system 300 (e.g., from the CDS network 310 via the amplifiers 315 to the CDS network 320), and an output of the CDS system 300 may be provided via the phase shifters 330 to the PA 254$pa$. The PA 254$pa$ amplifies the input signal and provides a transmit signal having a target output power level. The transmit signal is transmitted via the antenna(s) 350. A switch of a CDS network, such as the CDS network 320, may be opened when a corresponding path (e.g., of a plurality of paths 380) from the switch to an associated antenna 350 is not in use. The switch may be closed when the path from the switch to the associated antenna 350 is in use. In an illustrative embodiment, the switch may be opened and closed based on the value of a control signal. For example, the control signal may be received from the data processor/controller 280 or another device and may be provided to a gate of a transistor.

It should be noted that in alternative embodiments, the CDS system 300 may include more than two stages (e.g., more than two CDS networks). Moreover, the examples of 4-switch and 8-switch CDS networks in FIG. 3 are not meant to be limiting. In alternative embodiments, a CDS network may include a different number of switches. In addition, it should be understood that signal path(s) between antennas and a data processor/controller may include more, fewer, and/or different components than shown in FIG. 3. For example, in exemplary embodiments, a signal path may also include additional amplifiers, mixers, multipliers, an interface multiplexer (e.g., including high, medium, and/or low-pass filters), a wakeup detector, an RF controller, variable gain amplifiers, radio signal strength indicator (RSSI) measurement circuitry, etc.

It is noted that the passive CDS networks 310 and 320 of FIG. 3 are shared between the transmit paths and the receive paths coupled to the antennas 350, and therefore may be implemented using less area than using dedicated CDS networks for each of the transmit paths and the receive paths. The CDS networks may improve a signal-to-noise ratio of RF signals by reducing signal loss (as compared to a static summing/distribution network that has "open" paths that introduce signal loss). In addition, performance may be improved because the CDS networks maintain a low level of loss over each selected antenna subset (i.e., over each of the switch configurations). The disclosed CDS networks are useful in RF applications and may be used in mm-wave smart antenna arrays. In an alternative embodiment, CDS networks may not be shared between the transmit paths and the receive paths. In such an embodiment, switches may be duplicated between the transmit paths and the receive paths.

Figure 4:
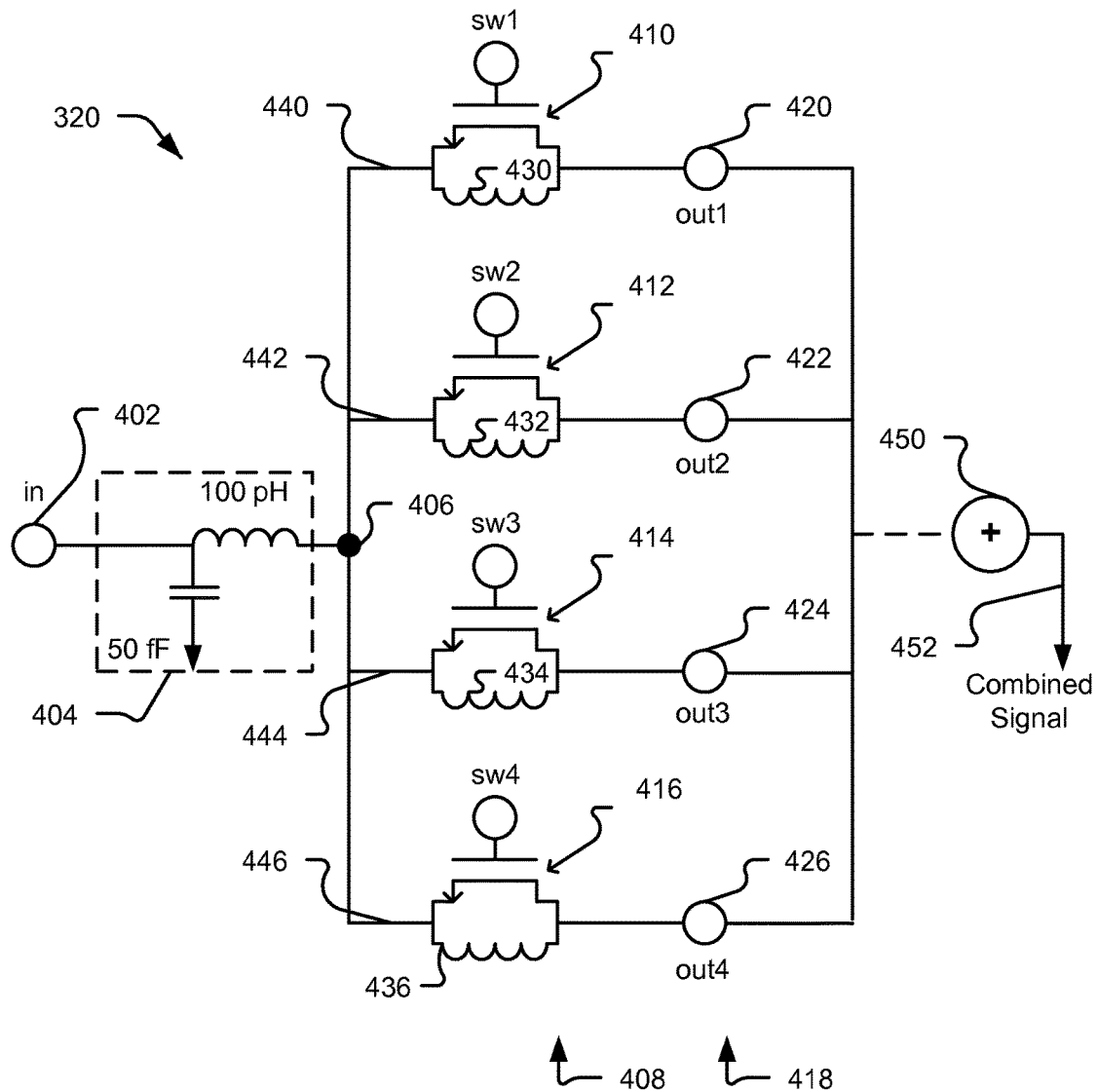
FIG. 4 shows an example of a representative configurable distribution and summing network.

FIG. 4 shows an exemplary design of the CDS network 320 (e.g., a 4-way CDS implementation). The 4-way CDS 320 shown in FIG. 4 includes an input 402, an impedance circuit 404, a common node 406, a plurality of switches 408 (e.g., 4 switches 410-416) and a plurality of outputs 418 (e.g. 4 outputs 420-426). Each of the plurality of switches 408 has a switch input (e.g., switch inputs 440-446 corresponding to input terminals of the switches 410-416).

Signals output by selected (e.g., closed) switches of the plurality of switches 408 may be combined by a combiner 450. The combiner 450 may produce a combined signal 452. In an illustrative example, the combined signal 452 may be provided to a next stage of a distribution and summing network or to a subsequent stage of a transmit or receive path (e.g., to or from an antenna). It is noted that the line between the switch outputs 420-426 and the combiner 450 is partially dashed to indicate that additional component(s) (e.g., amplifiers, phase shifters, etc.) may be present between the switch outputs 420-426 and the combiner 450. It should also be noted that although FIG. 4 illustrates a summer, in some examples the combiner 450 may additionally or alternatively include a common node coupled to each of the switch outputs 420-426, or any other component that is capable of combining signals.

Each switch of the plurality of switches 408 may include or correspond to a transistor, such as an n-type field effect transistor (NFET), a p-type field effect transistor (PFET), or another type of transistor, as illustrative non-limiting examples. Each of the plurality of switches 408 has an associated switch capacitance (e.g., a drain-source capacitance) when the switch is not activated, and each of the switch inputs 440-446 is coupled via a corresponding inductor 430-436 to a switch output 420-426 (e.g., switch outputs 420-426 corresponding to output terminals of the switches 410-416). For example, the input 440 to the switch 410 (SW1) is coupled via the inductor 430 to the output 420 (out1). The plurality of switches 408 (e.g., the switches 410-416) are coupled in parallel to the common node 406 that is coupled to the impedance circuit 404. The plurality of switches 408 may be used to open/close signal paths (e.g., for a receive signal or a transmit signal). As used herein, a switch input being "coupled" to a switch output by an inductor does not mean that the inductor will conduct a signal between the switch input and the switch output when the switch is closed. When the switch is closed, the inductor may be substantially bypassed, as further described herein. It is noted that techniques described herein are not used to affect operation of antenna(s), but rather more efficiently select how many antennas to distribute a signal to or to receive a signal from.

The sizes of the inductors 430-436 coupled to each of the switches 410-416, and/or the sizes of the switches 410-416 (e.g., switch transistors), may be determined based on a criterion. The criterion may be determined according to a formula to balance insertion loss in a first mode (e.g., when one or more switches are closed) with return loss in a second mode (e.g., when the one or more switches are open). In an illustrative example, each inductor and/or switch (e.g., transistor) is sized so that the combination of the inductor and the switch has a parallel resonance in the operating frequency (i.e., Fres, which is proportional to 1/sqrt(L*C), where Fres is the resonance frequency, sqrt is the square root operation, L is inductance of the inductor, and C is capacitance of the switch). This approach removes the effect of a signal bypassing an open (inactive) switch due to its capacitance. Moreover, the on (activated) resistance of the switch is sized to optimize (e.g., balance) between transmission loss (due to voltage drop on the switch), and return loss (due to impedance mismatch on a non-common node), across all operating modes. The impedance circuit 404 may be a matching network that is optimized (e.g., balanced) to provide sufficient impedance match on the "in" port across all of the operating modes.

To illustrate, the criterion may be based on all possible active (i.e., closed)/inactive (i.e., open) configurations of the plurality of switches. The inductors 430-436 may be sized based on a criterion of an active configuration of a plurality of possible configurations of the plurality of switches 408. For example, four switches that can be activated/deactivated independently of each other have 16 possible configurations. The inductors 430-436 may be selected based on the switch capacitance and to match (or substantially match) the input impedance (e.g., of the impedance circuit 404, which includes the 100 picohenry (pH) inductor and the 50 femtofarad (fF) capacitor) to maintain reasonable return loss and low insertion loss. In the case of the 4-switch arrangement shown in FIG. 4, sixteen operating modes are possible. To determine the sizes of the inductors and/or switches, simulations may be conducted to determine insertion loss and return loss for the sixteen operating modes based on different inductor/switch sizes. Size(s) may be selected such that average or "typical" insertion loss and return loss meets particular design criteria, such that a worst case insertion loss and return loss meets particular design criteria, or based on another performance criterion. In an illustrative example, the above steps may be repeated for other switch arrangements that are used in a CDS system, such as an 8-switch arrangement (e.g., for the CDS network 310), a 16-switch arrangement, etc., in order to configure an entire CDS network.

Thus, the CDS network 320 may have reasonable return loss and very low insertion loss in all possible configurations (e.g., in all 16 configurations) by utilizing a parallel inductor coupled to each switch of a CDS network (e.g., the CDS network 320) to resonate the drain-source capacitance and to improve isolation between antennas that are coupled to switches that are off and signal path(s) traveled by signals to/from antennas that are coupled to switches that are on. In a particular example, when the on-resistance of each switch was set to 20 ohms, the insertion loss varied from 2.5 decibels (dB) to 3 dB, and the return loss stayed below 11 dB across all modes/ports (e.g., across all 16 potential switch configurations and combinations of antennas that are on and off).

Thus, in accordance with a described example, a phased antenna array of a wireless device may include multiple inductors, where each inductor is in parallel with a corresponding switch. The inductors can be used to tune out capacitances of switches that are off and to electrically isolate amplifier circuitry coupled to switches that are off, which may reduce thermal noise and signal loss experienced by the wireless device during signal reception and signal transmission. Conversely, when a switch is on, the corresponding inductor may be substantially bypassed as a signal propagates through the switch. As shown in FIG. 4, an inductor and a capacitor may be connected in series with the input 402 and the parallel inductor/switch arrangements to match impedance. To enable sharing of functions between transmit and receive mechanisms, a switched passive element may be used (e.g., a switch structure, such as the plurality of switches 408, that is configured to perform 1-way, 2-way, 3-way, and/or 4-way switching). The described techniques may provide sufficiently low insertion loss and return loss over each possible configuration of switches that are on, thereby exhibiting robustness over process variations.

Figure 5:
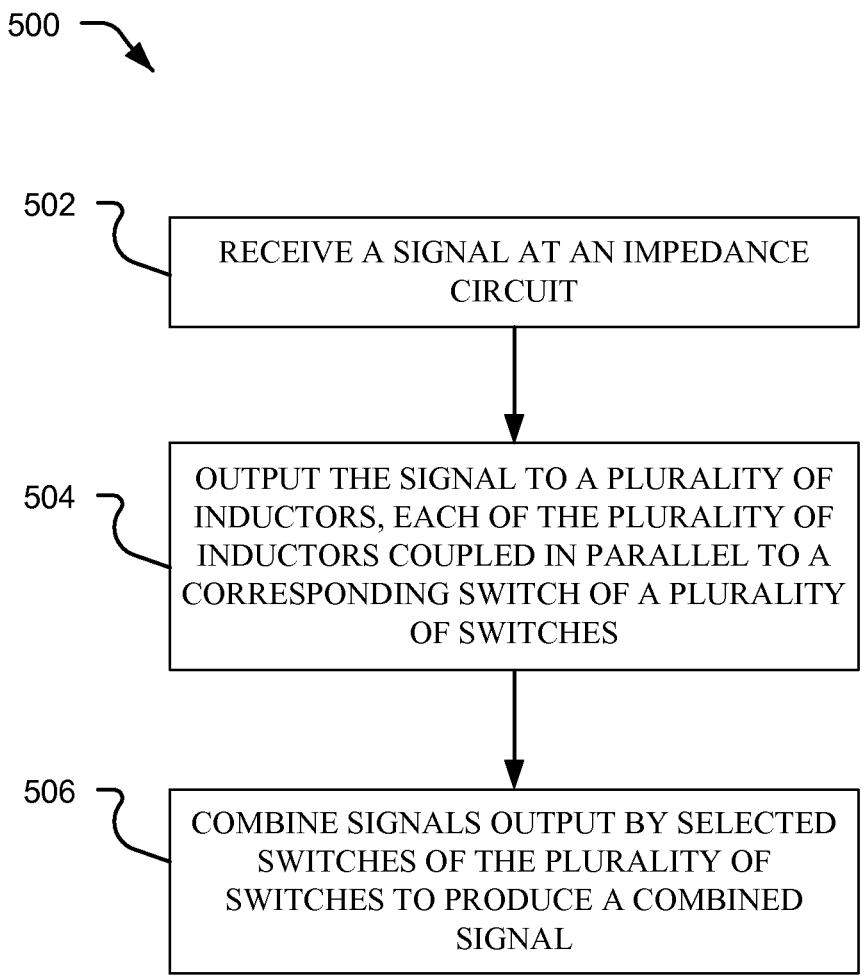
FIG. 5 shows a flowchart that depicts a method of communication using a switchable antenna array.

FIG. 5 is a flowchart of an exemplary embodiment of a method 500 of operation at the wireless device 110. The method 500 includes receiving a signal at an impedance circuit, at 502. The method 500 also includes outputting the signal to a plurality of inductors coupled to the impedance circuit, at 504, where each of the plurality of inductors is coupled in parallel to a corresponding switch of a plurality of switches. Each of the plurality of switches has a switch input that is coupled via the corresponding inductor to a switch output. For example, the plurality of switches may include the plurality of switches 408 of FIG. 4, which is coupled to the impedance circuit 404 via the common node 406.

In an exemplary embodiment, the plurality of switches may correspond to a stage of a power distribution and summing network, such as the first CDS network 310 or the second CDS network 320. In the example of FIG. 3, the first CDS network 310 includes eight switches, although the first CDS network 310 corresponding to the first stage may include a different number of switches in an alternative embodiment. For example, the first CDS network 310 may include N switches, where N is an integer greater than or equal to 2. Thus, the first CDS network 310 and the second CDS network 320 may include the same number or a different number of switches (and possible signal paths). In an exemplary embodiment, a switch may be selectively opened when corresponding antenna element(s) are not in use and may be selectively closed when corresponding antenna element(s) are in use. The method 500 may further include combining signals output by selected switches of the plurality of switches to produce a combined signal, at 506. For example, the combiner 450 of FIG. 4 may combine signals output by selected switches of the plurality of switches 408 (e.g., outputs of a subset (e.g., one, some, or all) of the plurality of switches that are in a closed state) to produce the combined signal 452. In an illustrative example, a switch may be opened when a path from the switch to a corresponding antenna is in use, and the switch may be closed when the path is not in use.

The method 500 of FIG. 5 may thus enable operation of a switchable phased antenna array in which different switches in different stages of CDS network(s) can be activated and deactivated independently of other switches (e.g., based on whether corresponding antenna element(s) are in use). Any combination of inputs to an N-switch structure may be combined to produce a combined signal. The CDS network(s) may improve a signal-to-noise ratio by reducing signal loss, and may improve performance by maintaining a low level of loss over each switch configuration. In one example, the described system may be used for antenna beam forming in a wireless device, although it is understood that the present disclosure is not limited to antenna beam forming.

In conjunction with the described embodiments, an apparatus includes means for providing impedance. For example, the means for providing impedance may include a component of the first CDS network 310, a component of the second CDS network 320, the impedance circuit 404 of FIG.

4, one or more other devices, circuits, or any combination thereof. The apparatus also includes means for switching including a plurality of switches coupled to the means for providing impedance. Each of the plurality of switches has a switch input that is coupled via a corresponding inductor to a switch output. For example, the means for switching may include switches of the first CDS network 310, switches of the second CDS network 320, the switches 410-416 of FIG. 4, one or more other devices, circuits, or any combination thereof. The apparatus may further include means for combining signals output by the plurality of switches. For example, the means for combining may include the combiner 450 of FIG. 4, one or more other devices, circuits, or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    an impedance circuit; and
    a plurality of inductors, each of the plurality of inductors coupled to the impedance circuit and coupled to a respective one of a plurality of non-grounded output terminals and each of the plurality of inductors coupled in parallel to a corresponding switch of a plurality of switches, wherein at least one switch of the plurality of switches is configured to be independently activated.

2. The apparatus of claim 1, further comprising a combiner responsive to the plurality of switches and configured to combine signals output by selected switches of the plurality of switches to produce a combined signal.

3. The apparatus of claim 1, wherein each switch is configured to selectively cause a signal received from the impedance circuit to bypass a respective inductor and to propagate from an input of the switch to an output of the switch.

4. The apparatus of claim 1, wherein each of the plurality of switches comprises a transistor, and wherein each of the transistors is sized based on a criterion to substantially balance impedance match in a first mode with series loss in a second mode.

5. The apparatus of claim 4, wherein the first mode corresponds to a closed switch and the second mode corresponds to an open switch.

6. The apparatus of claim 1, wherein each of the plurality of inductors is sized based on a criterion related to a plurality of configurations of the plurality of switches.

7. The apparatus of claim 1, wherein the plurality of inductors are coupled via a common node to the impedance circuit, and wherein the at least one switch is configured to be activated based on a value of a control signal.

8. The apparatus of claim 1, wherein the impedance circuit comprises:
    a second inductor coupled to an input and coupled to the plurality of inductors; and
    a capacitor coupled to the input and coupled to ground.

9. The apparatus of claim 1, wherein the plurality of inductors and the plurality of switches form a first stage of a distribution and summing network.

10. The apparatus of claim 9, wherein a second stage of the distribution and summing network includes a second plurality of switches, wherein the second stage is coupled via a plurality of amplifiers to a plurality of antennas.

11. The apparatus of claim 10, wherein the first stage of the distribution and summing network and the second stage of the distribution and summing network are shared between transmit and receive paths coupled to the plurality of antennas.

12. The apparatus of claim 10, wherein the first stage, the second stage, and the plurality of amplifiers are within a radio frequency integrated circuit.

13. The apparatus of claim 1, wherein the impedance circuit and the plurality of inductors are incorporated into a mobile communication device.

14. An apparatus comprising:
    means for providing impedance; and
    a plurality of means for inducting, each of the plurality of means for inducting coupled to the means for providing impedance and coupled to a respective one of a plurality of non-grounded output terminals and each of the plurality of means for inducting coupled in parallel to a corresponding switch of a plurality of switches, wherein at least one switch of the plurality of switches is configured to be independently activated.

15. The apparatus of claim 14, further comprising means for combining signals output by selected switches of the plurality of switches.

16. The apparatus of claim 14, wherein the at least one switch is configured to be activated based on a value of a control signal.

17. The apparatus of claim 16, wherein the plurality of switches corresponds to a first stage of a distribution and summing network, wherein the first stage is coupled via a plurality of amplifiers to a plurality of antennas, and wherein the first stage and the plurality of amplifiers are within a radio frequency integrated circuit.

18. A method of communication comprising:
receiving a signal at an impedance circuit;
outputting the signal to a plurality of inductors coupled to the impedance circuit and coupled to a respective one of a plurality of non-grounded output terminals, each of the plurality of inductors coupled in parallel to a corresponding switch of a plurality of switches; and
activating at least one switch of the plurality of switches to bypass a corresponding inductor of the plurality of inductors and to provide the signal to one of the plurality of non-grounded output terminals wherein the at least one switch of the plurality of switches is configured to be independently activated.

19. The method of claim 18, further comprising opening the at least one switch of the plurality of switches when a path from the at least one switch to an antenna is not in use, and closing the at least one switch when the path from the switch to the antenna is in use.

20. The method of claim 19, further comprising combining signals output by selected switches of the plurality of switches to produce a combined signal.

* * * * *